US007199826B2

(12) United States Patent
Uya

(10) Patent No.: US 7,199,826 B2
(45) Date of Patent: Apr. 3, 2007

(54) THIN-OUT DRIVE METHOD FOR CCD IMAGE SENSOR

(75) Inventor: Shinji Uya, Miyagi (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 621 days.

(21) Appl. No.: 10/084,366

(22) Filed: Feb. 28, 2002

(65) Prior Publication Data

US 2002/0135689 A1 Sep. 26, 2002

(30) Foreign Application Priority Data

Mar. 8, 2001 (JP) ............................ 2001-064917

(51) Int. Cl.
*H04N 3/14* (2006.01)

(52) U.S. Cl. ...................... 348/273; 348/277; 348/312; 348/320; 348/322

(58) Field of Classification Search ................ 348/272, 348/273, 320, 312, 274, 281, 282; 257/231
See application file for complete search history.

(56) References Cited

U.S. PATENT DOCUMENTS 5,880,781 A * 3/1999 Udagawa et al. ........... 348/279
6,559,889 B2 * 5/2003 Tanaka et al. .............. 348/299
6,750,911 B1 * 6/2004 Kobayashi et al. ......... 348/273

FOREIGN PATENT DOCUMENTS

JP 11-146408 5/1999
JP 2000-307961 11/2000

* cited by examiner

*Primary Examiner*—Ngoc-Yen Vu
*Assistant Examiner*—Anthony J. Daniels
(74) *Attorney, Agent, or Firm*—Arent Fox LLP

(57) ABSTRACT

A solid-state image pickup device includes photoelectric converters in row-column matrix configuration, VCCDs, one for each column, a color filter disposed above each converter to form a color filter array including layouts each including n rows, and a drive circuit for conducting readout treating (m*n) rows as one set, and selecting from the sets a plurality of units symmetrically distributed. Electric charge is read from the plural units. A first readout operation reads electric charge from a first group of rows having asymmetric distribution. A j-row transfer operation transfers the electric charge for j rows. A second readout operation reads electric charge from a second group of rows having asymmetric distribution at positions to which the electric charges are transferred by the j-row transfer operation. The electric charges are added in the VCCDs.

12 Claims, 8 Drawing Sheets

| | | | | | |
|---|---|---|---|---|---|
| φV1A | | X1 | G | R | L1 |
| φV2 | G | | | | |
| φV3A | | X2 | R | B | L2 |
| φV4 | R R | | | | |
| φV5A | | X3 | B | G | L3 |
| φV6 | B B B | | | | |
| φV7 | | | G | R | L4 |
| φV8 | | | | | |
| φV9 | | | R | B | L5 |
| φV10 | | | | | |
| φV11 | | | B | G | L6 |
| φV12 | | | | | |
| φV1B | G G | X2 | G | R | L7 |
| φV2 | | | | | |
| φV3B | | X3 | R | B | L8 |
| φV4 | R R R | | | | |
| φV5B | B | X1 | B | G | L9 |
| φV6 | | | | | |
| φV7 | | | G | R | L10 |
| φV8 | | | | | |
| φV9 | | | R | B | L11 |
| φV10 | | | | | |
| φV11 | | | B | G | L12 |
| φV12 | | | | | |
| φV1C | | X3 | G | R | L13 |
| φV2 | G G G | | | | |
| φV3C | | X1 | R | B | L14 |
| φV4 | R R | | | | |
| φV5C | | X2 | B | G | L15 |
| φV6 | | | | | |
| φV7 | R B B | | G | R | L16 |
| φV8 | | | | | |
| φV9 | | | R | B | L17 |
| φV10 | | | | | |
| φV11 | | | B | G | L18 |
| φV12 | | | | | |
| φV1A | | | G | R | L1 |
| φV2 | | | | | |
| φV3A | | | R | B | L2 |
| φV4 | | | | | |
| φV5A | | X3 | B | G | L3 |
| φV6 | B B | | | | |

THIN-OUT DRIVE METHOD FOR CCD IMAGE SENSOR

CROSS-REFERENCE TO RELATED APPLICATION

This application is based on and claims priority of Japanese Patent Application No. 2001-064917, filed on Mar. 8, 2001, the whole contents of which are incorporated herein by reference.

BACKGROUND OF THE INVENTION

A) Field of the Invention

The present invention relates to a solid-state image pickup device to be used for a digital still camera having a movie mode, and in particular, to a moving picture imaging technique of a solid-state image pickup device.

B) Description of the Related Art

In the digital still camera using a solid-state image pickup device, it is essential to have an image confirming function (movie mode) to confirm an image according to a movie picture produced by the camera. The number of pixels of the solid-state image pickup device is increasing every year. Solid-state image pickup devices available in the market have about 330 thousand pixels in 1996, about 800 thousand pixels in 1997, 1.5 million pixels in 1998, and more than 3 million pixels in 2000.

As a result of increase in the number of pixels as above, it became difficult to retain the mobile picture output function with picture quality substantially equal to that of the digital still camera, as in the prior art. To keep the picture quality of the prior art also in a digital still camera with an increased number of pixels, the drive frequency must be increased in proportion to the increase in the number of pixels. However, the operation frequency is not easily increased. When the circuit operation frequency is increased, power consumption of the camera is increased and the life of the camera driving battery becomes shorter. Additionally, noise appears easily in the image.

When it is attempted to increase the number of pixels of the solid-state image pickup device with the operation frequency kept unchanged, the frame rate must be lowered in the mobile picture shooting operation. When the culling rate of pixels in the readout operation is increased to keep the frame rate, false colors easily appear.

FIG. 8 shows a principle of a readout technique for mobile pictures as an example of a thin-out readout operation in a plan view.

As can be seen from FIG. 8, a charge-coupled device (CCD) solid-state image pickup device A includes a semiconductor substrate and a large number of photoelectric converter elements 103 formed in a contour of a matrix on a two-dimensional surface 101 of the semiconductor substrate. For each column of the photoelectric converter elements 103, one vertical charge transfer channel region (vertical charge-coupled device, VCCD) 105 is disposed to transfer electric charge stored in the photoelectric converter elements 103 in a vertical direction.

In one end portions of the vertical charge transfer channel regions 105, a horizontal charge transfer channel region (horizontal charge-coupled device, HCCD) 107 is disposed. The region 107 receives the electric charge transferred from the vertical charge transfer channel regions 105 and then transfers the electric charges in a horizontal direction. In one end portion of the horizontal charge transfer channel region 107, an output amplifier 111 is disposed. The amplifier 111 amplifies the electric charge from the horizontal charge transfer channel region 107 and then outputs the amplified electric signals to an external device.

In the CCD solid-state image pickup device A, colors are arranged in a so-called Bayer layout. In this layout, a column including green (G), red (R), G, R, . . . in this order in a column direction and a column adjacent thereto including blue (B), G, B, G, . . . in this order in the column direction are alternately disposed in a row direction. A row including R, G, R, G, . . . in this order in the row direction and a row adjacent thereto including G, B, G, B, . . . in this order in the row direction are alternately disposed in the column direction.

The rows shown in FIG. 8 are classified into groups each of which includes eight rows cyclically assigned with reference numerals L1 to L8, respectively. On the vertical charge transfer channel region, two vertical charge transfer electrodes are provided for each photoelectric converter element row, to which four kinds of voltages $\phi$V1 to $\phi$V4 can be independently applied.

Description will now be given of a quarter thin-out readout operation conducted in the movie mode by the CCD solid-state image pickup device A configured as above.

Signal charge of G, B, G, B, . . . and signal charge of R, G, R, G, . . . are read respectively from the photoelectric converter element rows L5 and L2 to be transferred to the vertical charge transfer channel region 105. By sequentially applying drive voltages to the vertical charge transfer electrodes, the signal charge is then transferred in a direction to the horizontal charge transfer channel region 107 in a 4-phase drive operation.

From the unit of eight photoelectric converter element rows, pixel signals of pixels of two rows are read out. That is, signals are read from a quarter of the overall pixels. This is called “quarter thin-out readout operation”. In this method, the imaging or image pickup operation can be conducted at a speed four times higher than that of the overall pixel readout operation employed to read out a still picture.

However, this method is attended with a problem. That is, when this method is used, the amount of signals is also lowered to a quarter of the original amount, and hence sensitivity is deteriorated. In the movie mode, the frame rate is 1/30 second (s). When this frame rate is kept unchanged, the sensitivity is insufficient in a dark place in most cases. Being different from the operation in the still picture mode, it is difficult to use a flash in the movie mode. Also, it is difficult in the movie mode to shoot a mobile picture using a long period of exposure time.

Additionally, since the signals are read out only from the photoelectric converter element rows L2 and L5, the intervals of rows between the photoelectric converter element rows for the signal readout operation are two and four. The intervals of two rows and four rows appear repeatedly. In other words, the photoelectric converter element rows for the signal readout operation are arranged with unequal intervals therebetween in the column direction. Therefore, the false colors easily occur. Influence of the false colors becomes stronger when the number of pixels not read out in the thin-out readout operation is increased.

A unique problem regarding false colors in a digital still camera is a problem of mismatching of an optical low-pass filter. An optical low-pass filter is disposed to reduce occurrence of the false color. In digital still camera, a pitch of the birefringence of the optical low-pass filter is determined based on the still picture imaging operation.

Therefore, when the non-uniform thin-out readout operation is conducted for a mobile picture, the readout pitch is not fixed because of the unequal intervals described above, and hence does not match the pitch of the optical low-pass filter for still pictures. There exists a tendency that as the number of pixels of the solid-state image pickup device increases, the mismatching between the readout pixel pitch for the operation to shoot a mobile picture and the pitch of the optical low-pass filter increases.

SUMMARY OF THE INVENTION

It is therefore an object of the present invention to improve sensitivity in the imaging operation in the movie mode so that a bright image is displayed also in the movie mode.

Another object of the present invention is to lower the influence of the false color.

According to one aspect of the present invention, there is provided a solid-state image pickup device, comprising a semiconductor substrate having a two-dimensional plane on a surface thereof; photoelectric converter elements arranged in a matrix configuration having rows and columns, and formed in said two-dimensional plane; one vertical charge transfer channel region formed in said semiconductor substrate for each of the columns of said photoelectric converter elements, adjacent to said each column; two charge transfer electrodes so disposed over said vertical charge transfer channel regions for each of the rows of said photoelectric converter elements as to intersect said vertical charge transfer channel regions; an array of color filters each of which is formed for each of said photoelectric converter elements over said each photoelectric converter element, said array including color layouts each of which includes n rows of said color filters; and a drive circuit for conducting a readout operation in which (m*n) rows of photoelectric converter elements are classified as one set, a plurality of units of photoelectric converter element rows which are symmetrically distributed are respectively selected from said sets of photoelectric converter element rows, and electric charge is read from said plural units of photoelectric converter element rows to be fed to said vertical charge transfer channel regions, said readout operation comprising: a first readout operation for reading electric charge from a first group of photoelectric converter element rows which have an asymmetric distribution, into said vertical charge transfer channel regions; a i-row transfer operation for transferring the electric charge for j rows after said first readout operation; and a second readout operation for reading electric charge from a second group of photoelectric converter element rows which have an asymmetric distribution at positions to which the electric charge is transferred by said j-row transfer operation, into said vertical charge transfer channel regions, and for adding the electric charges to each other in said vertical charge transfer channel regions, said first and second readout operations reading electric charge from two rows included in one unit of photoelectric converter element rows.

According to another aspect of the present invention, there is provided a method of controlling a solid-state image pickup device comprising a semiconductor substrate having a two-dimensional plane on a surface thereof, photoelectric converter elements arranged in a matrix configuration having rows and columns, and formed in said two-dimensional plane, one vertical charge transfer channel region formed in said semiconductor substrate for each of the columns of said photoelectric converter elements, adjacent to said each column, two charge transfer electrodes so disposed over said vertical charge transfer channel regions for each of the rows of said photoelectric converter elements as to intersect said vertical charge transfer channel regions, and an array of color filters each of which is formed for each of said photoelectric converter elements over said each photoelectric converter element, said array including color layouts each of which includes n rows of said color filters, said method comprising the steps of; (a) classifying (m*n) rows of photoelectric converter elements as one set, selecting a plurality of units of photoelectric converter element rows, which are symmetrically distributed, respectively from said sets of photoelectric converter element rows, reading electric charge from a first group of photoelectric converter element rows which have an asymmetric distribution in said unit thus selected and feeding the electric charge into said vertical charge transfer channel regions; (b) transferring the electric charge for j rows after said readout step (a); and (c) reading electric charge from a second group of photoelectric converter element rows which have an asymmetric distribution at positions to which the electric charge is transferred by said transfer step (b), feeding the electric charge to said vertical charge transfer channel regions, and adding the electric charges to each other in said vertical charge transfer channel regions, said first and second readout steps (a) and (c) reading electric charge from two rows contained in one unit of photoelectric converter element rows.

In the technique to control the solid-state image pickup device, before the signal charge is transferred to the horizontal charge transfer channel region, signal charges of two pixels of the same color are added in the vertical charge transfer channel region. Therefore, the amount of signals and hence the sensitivity is doubled, and a bright mobile picture is obtained.

The photoelectric converter element rows used for the signal readout operation and those not used therefor are arranged with an equal interval in the row direction. This consequently reduces the influence of the false color. The pitch of the optical low-pass filter adjusted for the operation to shoot still pictures matches that of the photoelectric converter element rows for the readout operation in the movie mode.

As above, the false color can be prevented while increasing the sensitivity of the digital still camera in the movie mode.

DESCRIPTION OF THE PREFERRED EMBODIMENTS

Figure 1:
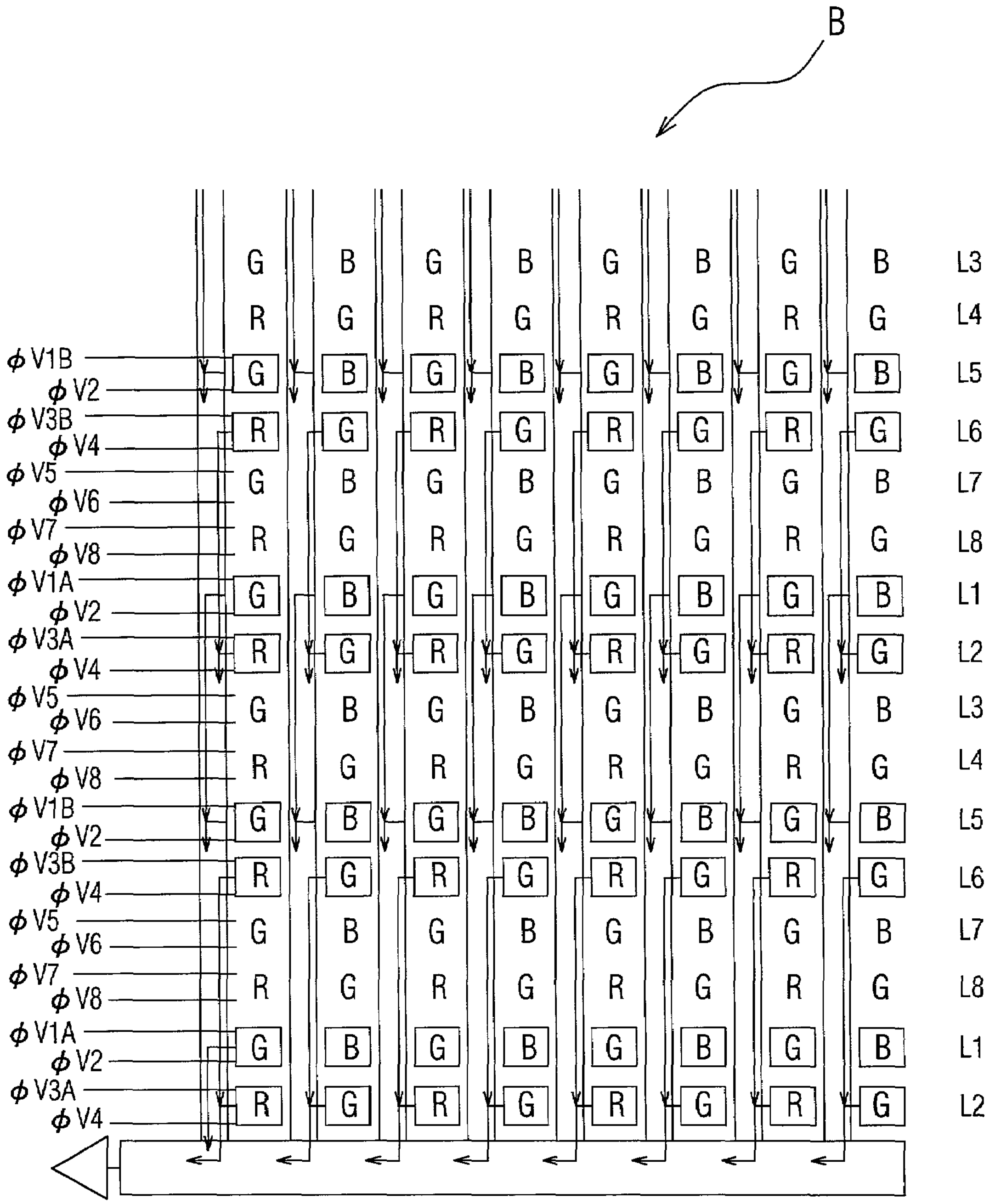
FIG. 1 is a plan view schematically showing a principle of a technique to control a solid-state image pickup device according to the present invention.

Referring now to FIG. 1, description will be given of a principle of a solid-state image pickup device and a control method thereof devised by the present inventor.

FIG. 1 shows a principle of a solid-state image pickup device devised by the present inventor. In the device of FIG. 1, colors or color filters are arranged in a Bayer layout. The Bayer layout is a representative layout of color filters and belongs to a group of color filter layouts in which the same color appears in a two-pixel pitch in the column direction.

As shown in FIG. 1, in a solid-state image pickup device, the color layout in the row direction varies from one photoelectric converter row to the next row and the same color layout appears in every second row. Assuming that eight photoelectric converter rows form one unit or group, the same unit repeatedly appear in a direction from an upper end to a lower end of FIG. 1, namely, in the vertical direction. For simple description, eight rows in each unit are assigned with reference numerals L1 to L8. To transfer electric charge in the vertical charge transfer channel region, two electrodes including an upper vertical charge transfer electrode and a lower vertical charge transfer electrode are disposed for each photoelectric converter row.

Assume in the solid-state image pickup of FIG. 1 that electric charge is read from four photoelectric converter rows including two sets of adjacent two photoelectric converter rows in the column direction, for example, L1 and L2 and L5 and L6.

First, electric charge accumulated in the photoelectric converter elements belonging to the rows L1 and L6 is read therefrom to be fed to the vertical charge transfer channel regions respectively associated therewith. Next, the electric charge are transferred in a direction toward the horizontal charge transfer channel region by four photoelectric converter rows. Resultantly, the electric charge from the row L1 is transferred up to the row L5. The signal charge of the row L1 and that of the row L5 have the same color layout in the row direction. The electric charge from the row L6 is also transferred by four rows up to the row L2. The signal charge of the row L2 and that of the row L6 have also the same color layout in the row direction.

When the readout operation is again conducted in this state, the signals of the same color can be added to each other. That is, when signal charge is read from the photoelectric converter elements belonging to the rows L2 and L5, signal charge of the same color is added in the vertical charge transfer channel region. The resultant signal charge of two pixels is then transferred toward the horizontal charge transfer channel region.

As a result of the operation, signal charges are read from the adjacent first and second photoelectric converter rows L1 and L2 adjacent to each other in the column direction and the adjacent fifth and sixth rows L5 and L6 adjacent to each other in the column direction, in each group including the rows L1 to L8. The non-readout rows not used for the readout operation include the third and fourth rows L3 and L4 and the seventh and eighth rows L7 and L8. The readout rows and the non-readout rows are arranged with an equal interval of two rows in the column direction.

In the solid-state image pickup device, before the electric charge is transferred to the horizontal charge transfer channel region, the signal charges of two pixels of the same color are added to each other in the vertical charge transfer channel region. Therefore, the amount of signals and hence the sensitivity are doubled to resultantly display a bright mobile picture.

The readout rows and the non-readout rows are arranged with an equal interval, an interval of two rows in this case, in the column direction. Therefore, the influence of the false color is lowered. Additionally, since the pitch of the optical low-pass filter adjusted to shoot still pictures can match that of the photoelectric converter rows for the readout operation in the movie mode, a favorable mobile picture is obtained.

The readout method can also be considered as a readout method in which an optical double image is formed as if such an optical low-pass filter is used that has a pitch substantially equal to the interval between an objective photoelectric converter row and a fourth adjacent photoelectric converter row in the column direction.

Referring to FIGS. 2, 3A, 3B, 4, and 5, description will be given of a solid-state image pickup device in an embodiment of the present invention and a control method thereof according the principle.

Figure 2:
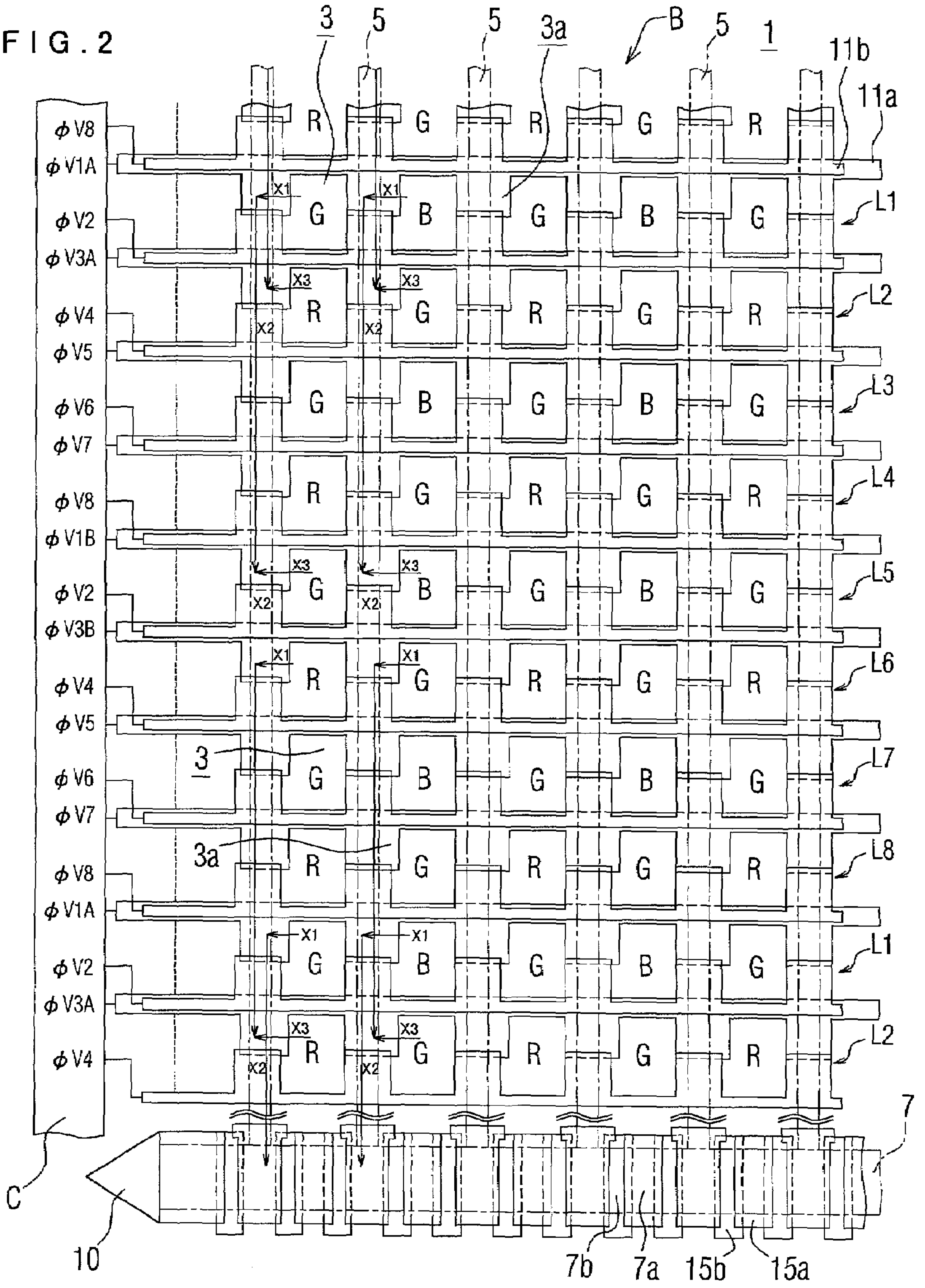
FIG. 2 is a plan view schematically showing a configuration of a solid-state image pickup device in an embodiment according to the present invention.
Figure 3A:
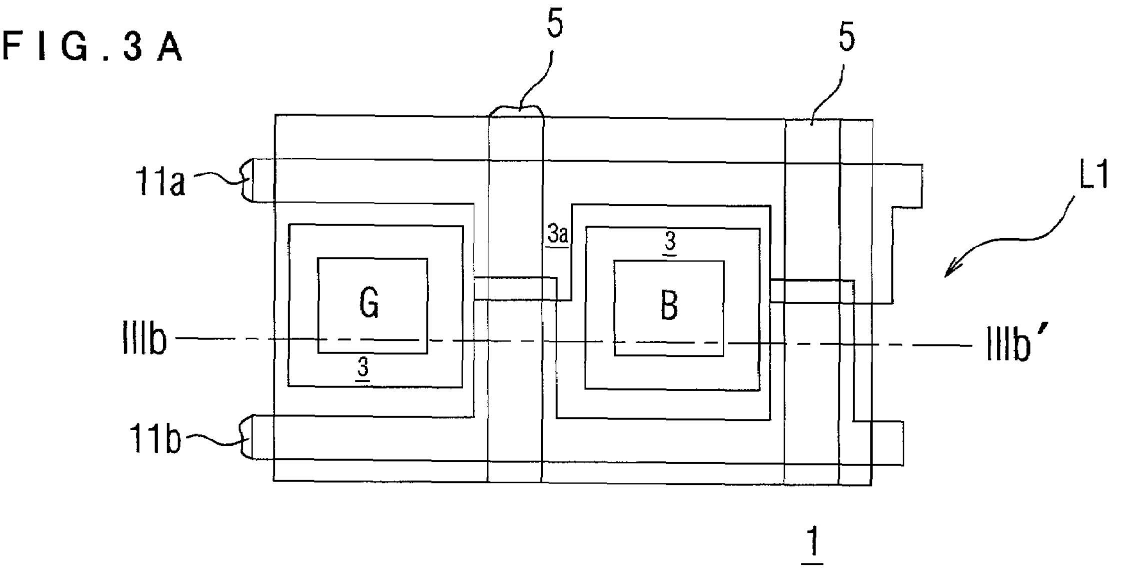
FIG. 3A is a magnified view of portion of FIG. 2.
Figure 3B:
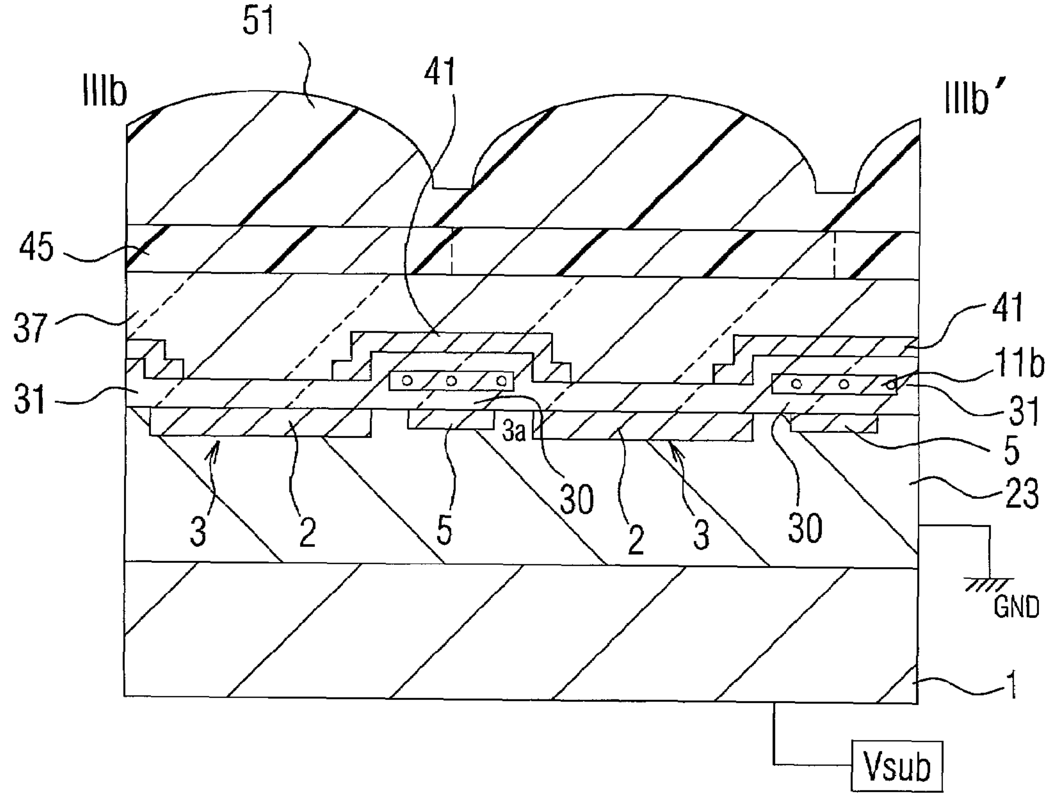
FIG. 3B is a cross-sectional view along line IIIb–IIIb' of FIG. 3A.
Figure 4:
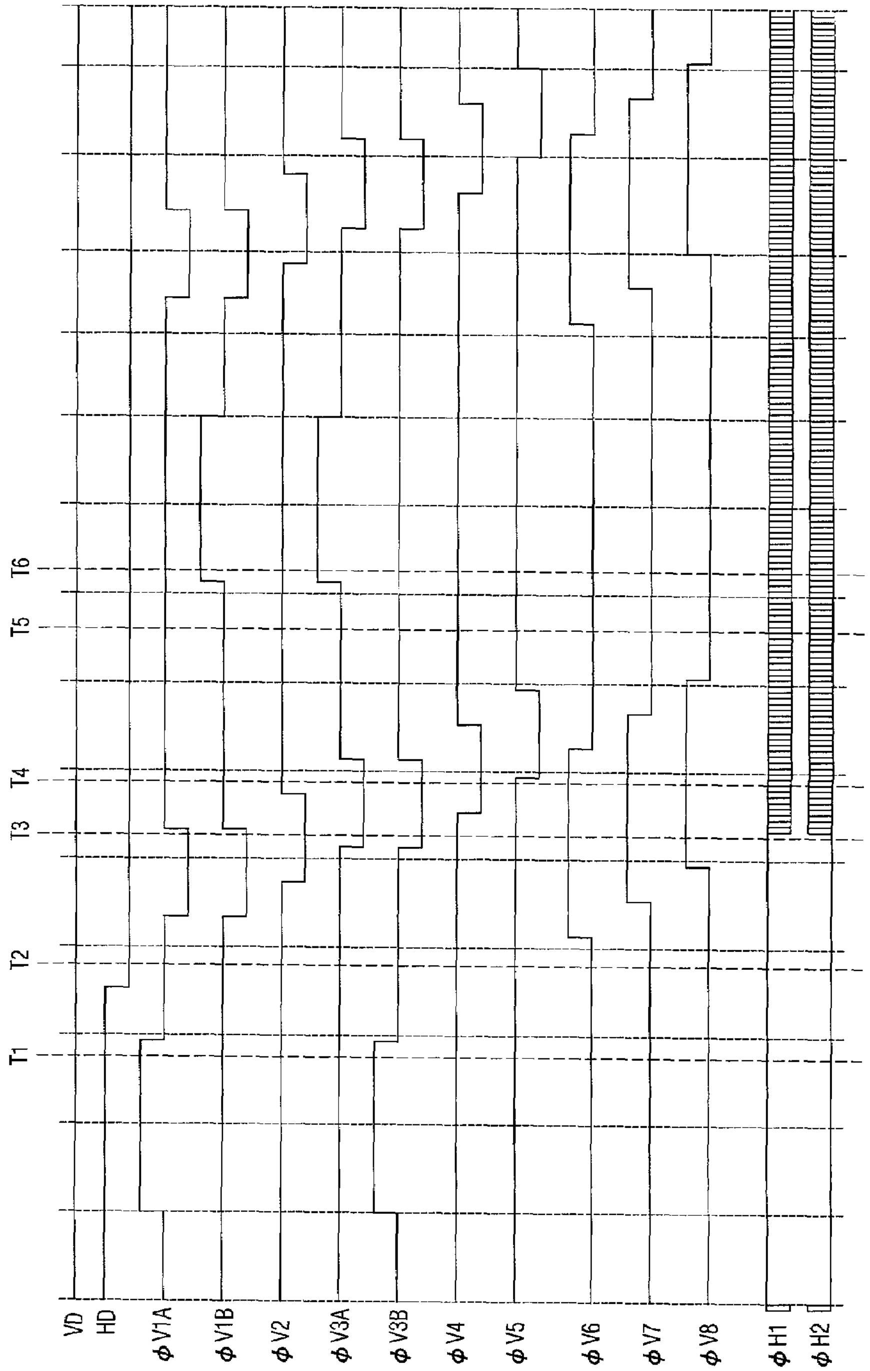
FIG. 4 is a signal timing chart showing a technique to control a solid-state image pickup device according to the present invention.
Figure 5:
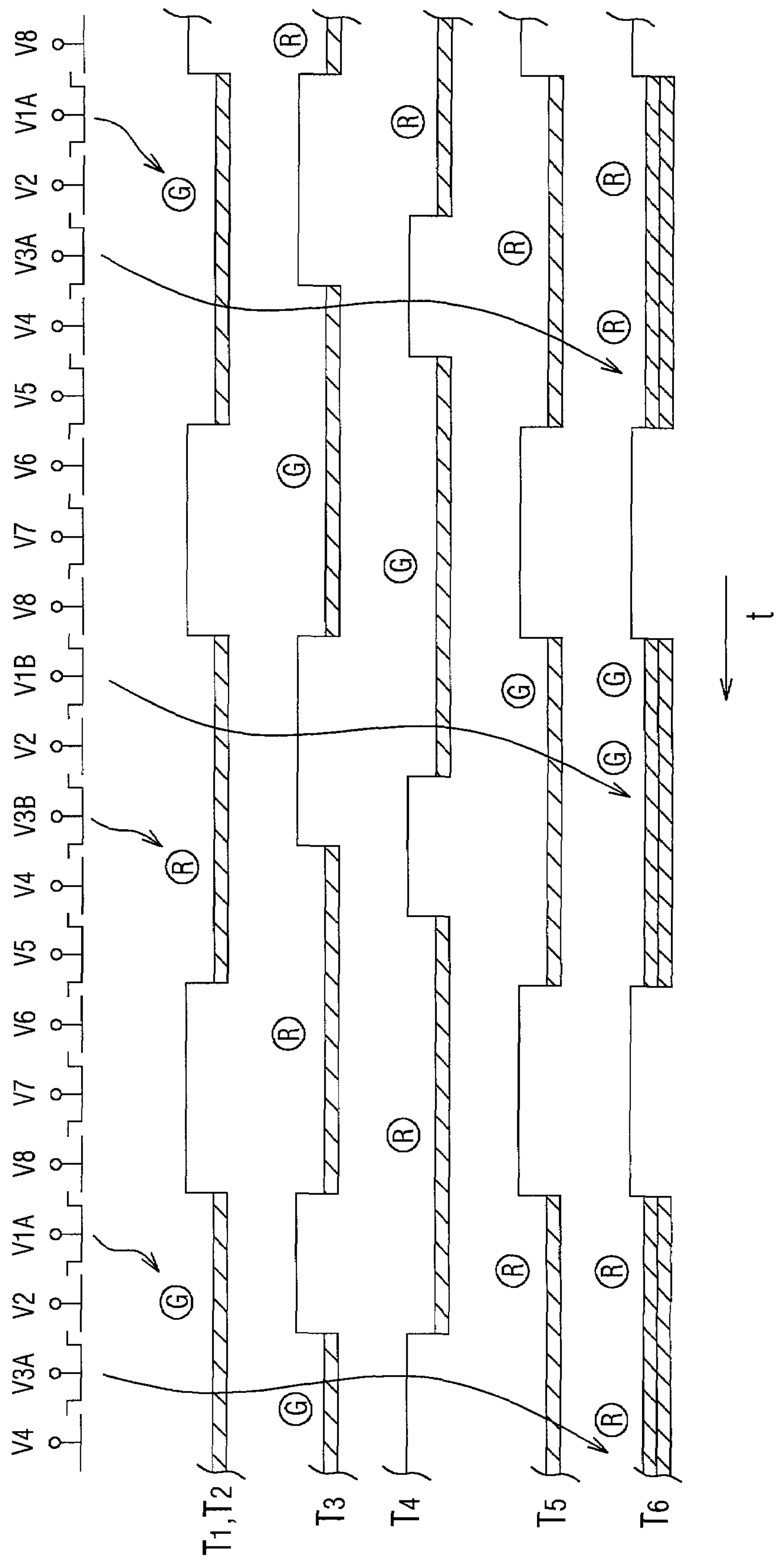
FIG. 5 is a schematic diagram showing charge transfer operations according to the signal timing chart of FIG. 4.

FIG. 2 shows a configuration of a solid-state image pickup device in this embodiment in a plan view. FIG. 3A shows a magnified view of portion of FIG. 2 and FIG. 3B shows a cross-sectional view along line IIIb–IIIb' of FIG. 3A. FIG. 4 is a signal timing chart of drive signals applied to a charge drive section of the solid-state image pickup device. FIG. 5 shows electric charge readout and transfer operations when the device is driven at timing shown in the signal timing chart of FIG. 4.

As shown in FIG. 2, on a semiconductor substrate 1 defining a two-dimensional plane, photoelectric converter elements or photodiodes 3 are formed in a contour of an array on the two-dimensional plane. In the vicinity of each column of photoelectric converter elements extending in the column direction, one vertical charge transfer channel region 5 extends in the vertical direction (column direction). One readout gate region 3*a* is formed between each of the photoelectric converter elements 3 and the vertical charge transfer channel region 5.

In one end portion of the vertical charge transfer channel region 5, a horizontal charge transfer channel region 7 is formed to extend in the horizontal direction (row direction). In one end portion of the horizontal charge transfer channel region 7, an output amplifier 10 is formed. The amplifier 10 amplifies a charge signal and output the amplified charge signal to an external device.

On the vertical charge transfer channel regions 5, two vertical charge transfer electrodes including one upper electrode 11*a* and one lower electrode 11*b* are formed for each photoelectric converter element. For the horizontal charge transfer channel region 7, a potential well region 7*a* and a potential barrier region 7*b* are alternately formed in the horizontal direction. One end of each vertical charge transfer channel regions 5 is connected to the potential well region 7*a*. On the potential well region 7*a* and the potential barrier region 7*b*, a horizontal charge transfer electrode 15*a* and a horizontal charge transfer electrode 15*b* are respectively formed.

When voltages are applied to the vertical charge transfer electrodes 11*a* and 11*b*, electrons in the vertical charge transfer channel regions 5 are transferred toward the horizontal charge transfer channel region 7.

By applying voltages to the horizontal charge transfer electrodes 15*a* and 15*b*, the electrons transferred to the horizontal charge transfer channel region 7 are further transferred toward the output amplifier 10.

In FIG. 2, between the vertical charge transfer channel region 5 and the horizontal charge transfer channel region 7, the vertical charge transfer electrodes are shown up to the vertical charge transfer electrode (φV4). Actually, when the vertical charge transfer electrodes φV5 to φV8 and a charge transfer area to transfer electric charge from the vertical charge transfer channel regions to the horizontal vertical charge transfer channel region are additionally arranged, the readout and transfer operation of electric charge can be conducted according to the signal timing charge shown in FIG. 4. This also applies to the conceptual diagram of FIG. 1.

FIG. 3A shows a magnified view of portion of the solid-state image pickup device of FIG. 2 in a plan view and FIG. 3B shows a cross-sectional view along line IIIb–IIIb' of FIG. 3A.

As can be seen from FIGS. 3A and 3B, in one surface of an n-type semiconductor substrate, a p-type semiconductor layer or region 23 is formed. In the p-type semiconductor region 23, n-type semiconductor regions 2 and 5 are formed. The n-type semiconductor region 2 and the p-type semiconductor region 23 constitute a photoelectric converter element or a photodiode 3 including a p-n junction therebetween.

The n-type semiconductor region 5 serves as a vertical charge transfer channel region to transfer electric charge from the photoelectric converter element 3. On the vertical charge transfer channel region 5, a charge transfer electrode 11*b* is formed using polycrystalline silicon with a first insulation layer 30 therebetween.

A first charge transfer electrode 11*a* and a second charge transfer electrode 11*b* are alternately formed in the vertical direction, and vertical charge transfer paths are formed together with the vertical charge transfer channel region 5. The vertical charge transfer paths transfer electric charge accumulated in the photoelectric converter elements 3 associated therewith toward the horizontal charge transfer channel region 7 (FIG. 2).

On the semiconductor substrate 1, a first interlevel insulating layer 31 is formed to cover the first and second charge transfer electrodes 11*a* and 11*b*. On the first interlevel insulating layer 31, a conductive light shielding layer 41 is formed with openings over a light receiving surface of each photoelectric converter element 3. The conductive light shielding layer 41 covers areas not to receive light, for example, the areas of the vertical charge transfer paths 5, 11*a*, 11*b*. The layer 41 reduces influence of incident light in areas other than those of the photoelectric converter elements 3.

A second interlevel insulating layer (planarizing layer) 37 is formed to cover the insulating layer 31 and the light shielding layer 41. On the planarizing layer 37, color filters 45 and microlenses 51 are formed. Light collected by the microlens 51 passes through the color filter 45 associated therewith to be converted into, for example, monochromatic light and then enters the photoelectric converter element 3 associated therewith.

Returning to FIG. 2, on the left side of the light receiving area including the photoelectric converter elements 3, a vertical drive circuit C is disposed to apply charge transfer voltages to the charge transfer electrodes 11*a* and 11*b*. The vertical drive circuit C can conduct a drive operation in a unit of four photoelectric converter rows, e.g., a unit including the photoelectric converter rows L1 to L4 and a unit including the photoelectric converter rows L5 to L8. In the drive operation, the vertical drive circuit C applies drive voltages φV1 to φV8 to each of the charge transfer electrodes 11*a* and 11*b*. There is conducted a charge transfer operation in a so-called 8-phase drive method. For φV1 and φV3, different voltages (readout voltages) can be applied, specifically, φV1A and φV1B for the photoelectric converter rows L1 to L4 and φV3A and φV3B for the photoelectric converter rows L5 to L8. Therefore, electric charge can be independently read from another photoelectric converter row.

Referring to FIGS. 2, 4, and 5, operation of the solid-state image pickup device will be described. At time T1, the vertical drive circuit C applies a high voltage (readout voltage), for example, 16 V to φV1A and φV3B. Signal charge aligned as GBGBGB . . . in the first photoelectric converter row L1 in the row direction is read out to be fed into the vertical charge transfer channel regions (as indicated by X1). Signal charge aligned as RGRGRG . . . in the sixth photoelectric converter row L6 in the row direction is read out to be fed into the associated vertical charge transfer channel regions (as indicated by X1).

During a period of time from time T2 to time T5, the signal charge read out in the above operation is transferred toward the horizontal charge transfer channel region in the 8-phase drive method. Voltages to drive the signal charge are, for example, 0 V and −8V. Signal charge GBGB GB . . . read from the first photoelectric converter row L1 is transferred up to a position of the fifth photoelectric converter row L5 (as indicated by X2). Signal charge RGRGR G . . . read from the sixth photoelectric converter row L6 is transferred up to a position of the second photoelectric converter row L2 (as indicated by X2).

In this state, the signal charge existing in each photoelectric converter element of each associated vertical charge transfer channel region is equal in color to electric charge accumulated in the photoelectric converter element next to the pertinent photoelectric converter element with a readout gate therebetween.

At time T6, the vertical drive circuit C applies a high voltage, i.e., a readout voltage, for example, 16 V to φV1B and φV3A. Signal charge GBGBGB . . . and RGRGR G . . . transferred by the charge transfer operation as above and signal charge GBGBGB . . . and RGRGRG . . . read from the photoelectric converter elements are respectively mixed with each other (as indicated by X3). In each mixing operation, since the signal charge and the signal charge to be mixed therewith are equal in color, the mixing operation is an addition between the signal charge. Each electric charge existing in each vertical charge transfer channel region is resultantly represented as RR, GG, or BB.

The charge added as above is transferred toward the horizontal charge transfer channel region in response to drive signals applied to the electric charge transfer electrodes from the vertical drive circuit C. The signal charge transferred into the horizontal charge transfer channel region is transferred therethrough toward the output amplifier and is then amplified to be outputted to an external device. Actually, after the electric charge is transferred to a region under the vertical electric charge transfer electrodes applied with φV8, it is only necessary to transfer the electric charge from the vertical electric charge transfer channel regions to the horizontal charge transfer channel region through a known charge transfer area in which independent charge transfer pulse signal is applied to an electrode like the vertical charge transfer electrodes. It is only necessary to start the charge transfer operation of the horizontal charge transfer channel region after the electric charge is transferred from the vertical electric charge transfer channel regions to the horizontal charge transfer channel region.

There also exists a fear that as a result of the addition of the signal charge, an excessive amount of electric charge exists in the vertical charge transfer channel regions and overflows therefrom. To overcome this difficulty, a substrate potential is favorably applied to the n-type semiconductor substrate 1 (FIG. 3). This leads to a so-called vertical overflow drain (VOFD) configuration. In the VOFD configuration, by beforehand lowering a potential barrier between the substrate and the photoelectric converter elements by the substrate voltage, it is possible to reduce a maximum amount of charge which can be accumulated in each photoelectric converter element. By adjusting the amount of signal charge which can be accumulated in the photoelectric converter element, the overflow of charge from the vertical charge transfer channel regions as a result of the addition of the signal charge in the vertical charge transfer channel regions.

In the solid-state image pickup device, before the signal charge is transferred to the horizontal charge transfer channel region, the electric charge of two photoelectric converter elements of the same color is added to each other in vertical charge transfer channel regions. Therefore, the amount of signal charge, namely, the sensitivity is doubled and a bright mobile picture is obtained.

Although each readout pattern is asymmetric, the readout pattern as a whole becomes symmetric.

When eight rows are collected as one unit, the signal charge read from two photoelectric converter elements separated by four rows from each other is added to each other. That is, the signal charge is read from positions equally separated from each other in the column direction. Therefore, the influence of the false color becomes smaller. In addition, since the pitch of the photoelectric converter rows to which the readout signal is applied matches that of the optical low-pass filter adjusted for the operation to shoot still pictures, a favorable mobile picture is obtained.

In the still picture mode in which the overall pixel readout operation is conducted, the readout pulse signal is applied to every second photoelectric converter rows to read out signal charge. The signal charge read from the elements are transferred through the horizontal charge transfer channel regions, and then to the horizontal charge transfer channel region. In the still picture mode, the addition of signal charge is not conducted. Therefore, it is only necessary in the VOFD configuration to set the substrate voltage to a value lower than that used in the movie mode. For example, the maximum amount of charge which can be accumulated in each photoelectric converter element is set about 2 times as that of the movie mode.

The technique to control the solid-state image pickup device according to the embodiment is suitably applied to a solid-state image pickup device in which every second pixels have the same color in the column direction.

Figure 6:
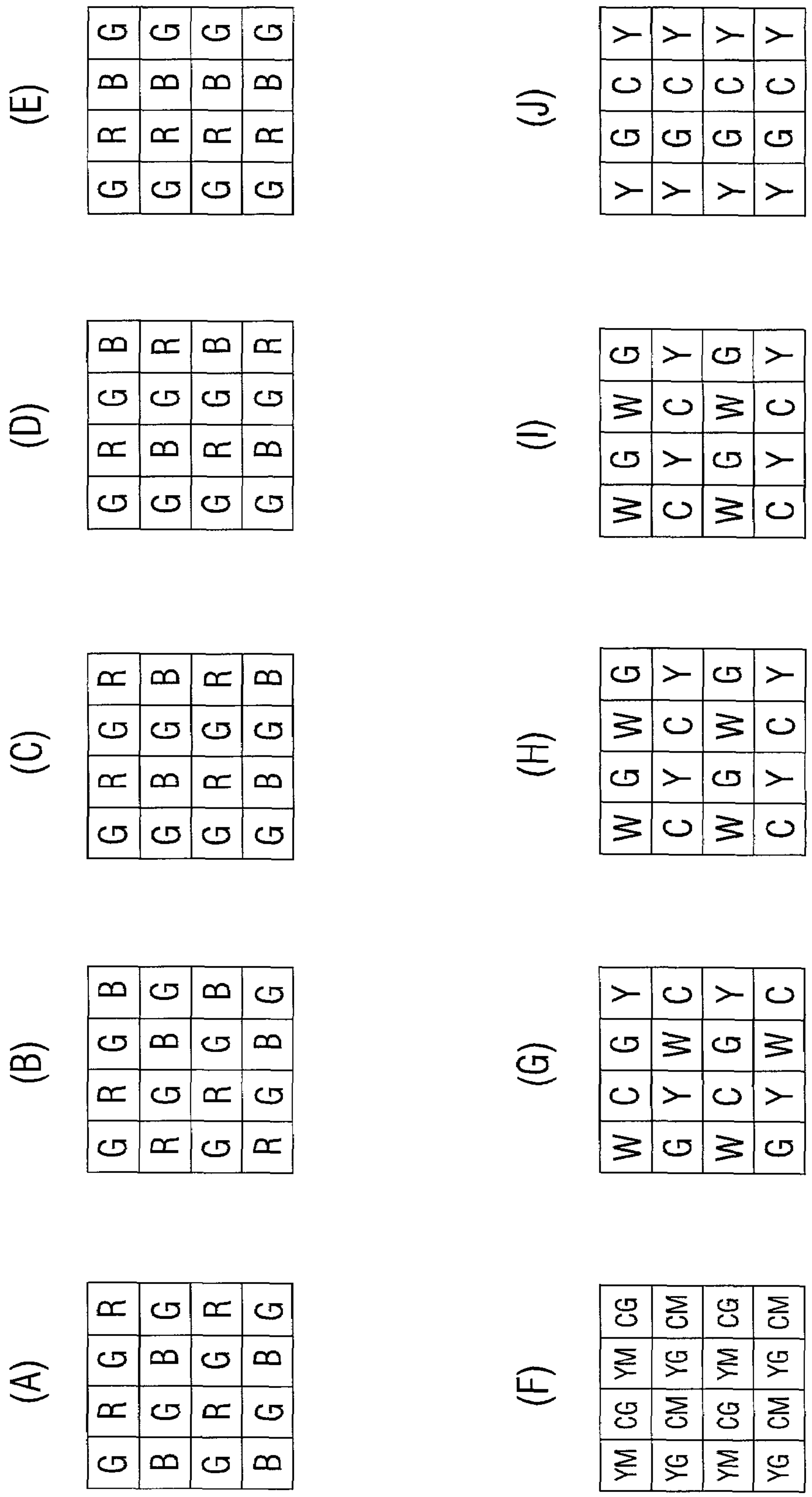
FIG. 6A to FIG. 6J are plan views showing examples of color filters applicable to a solid-state image pickup device in an embodiment according to the present invention.

FIGS. 6A to 6J show examples of color layouts applicable to the solid-state image pickup device according to the embodiment. FIG. 6A is a Bayer layout, FIG. 6B is an interline layout, FIG. 6C is a striped RB zigzag layout, FIG. 6D is a G striped RB complete zigzag layout, FIG. 6E is a striped layout, FIG. 6F is a frame color-difference sequential layout, FIG. 6G is an MOS layout, FIG. 6H is a modified MOS layout, FIG. 61 is a complementary color frame interleave layout, and FIG. 6J is a complementary color striped layout.

Figure 7:
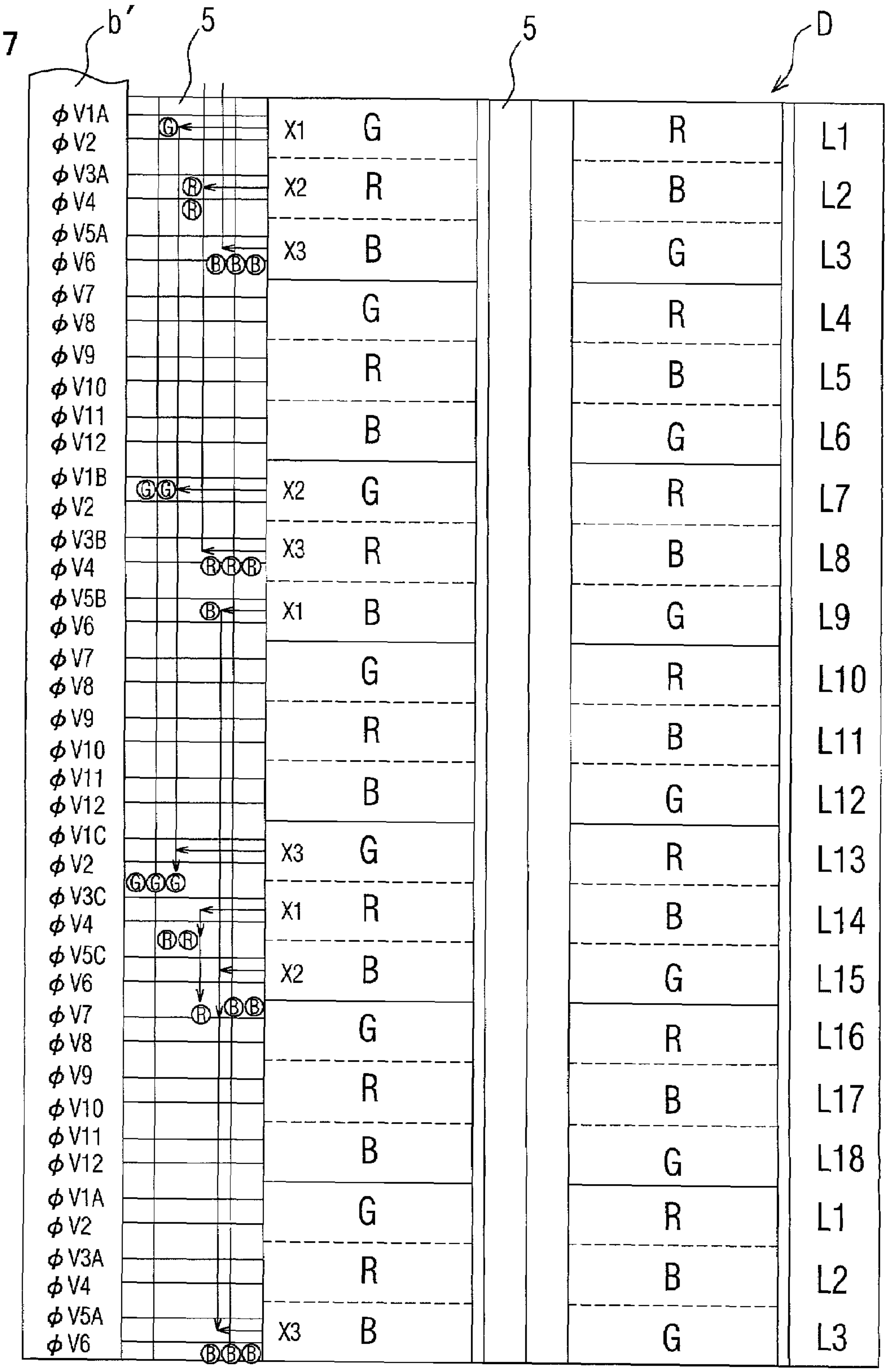
FIG. 7 is a plan view schematically showing a configuration of a variation of a solid-state image pickup device in an embodiment according to the present invention.
Figure 8:
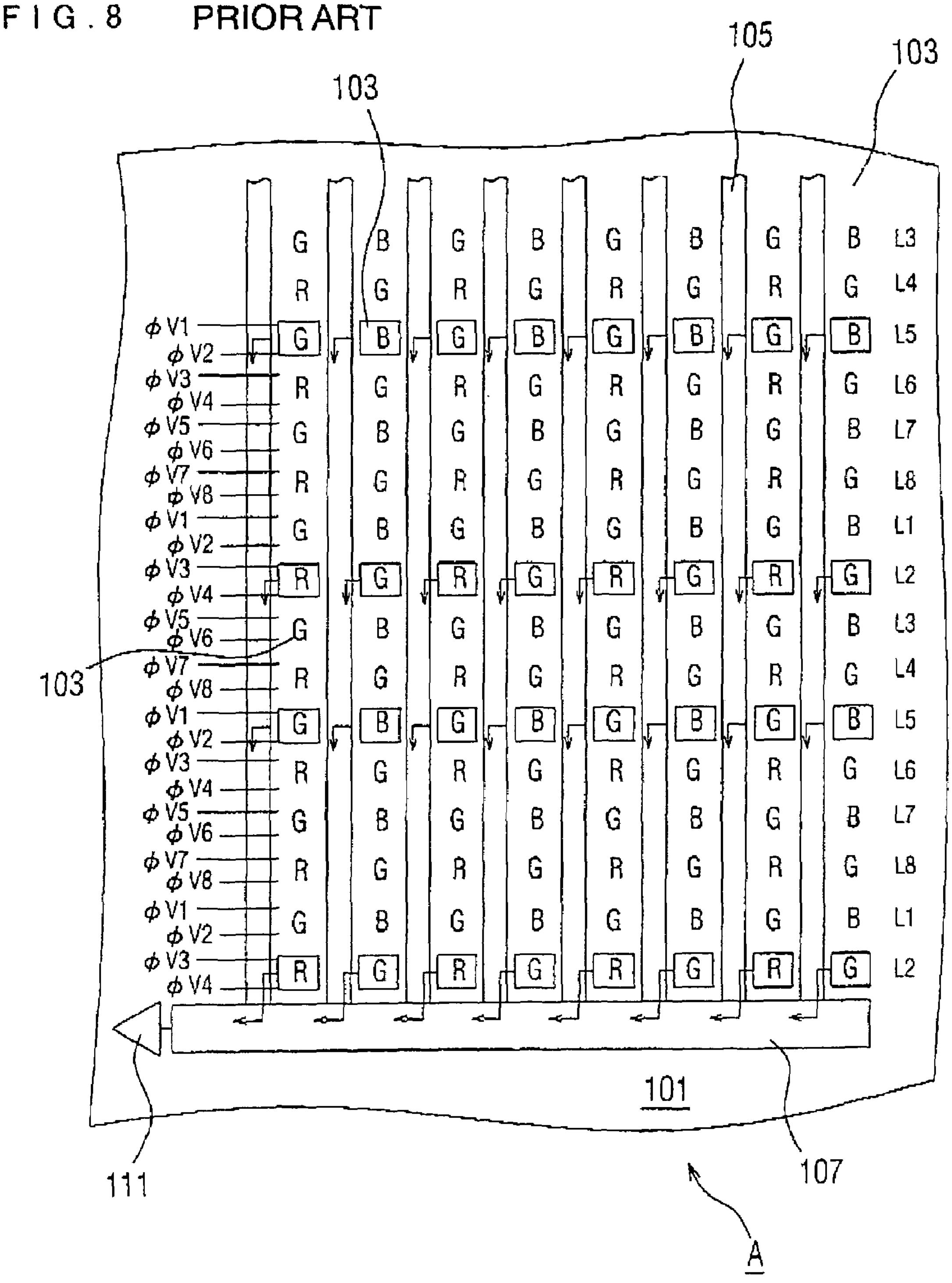
FIG. 8 is a plan view for explaining a technique to control a solid-state image pickup device in a thin-out method of the prior art.

Referring now to FIG. 7, description will be given of a control technique as a variation of the control technique of the solid-state image pickup device according to the embodiment. For simplicity of the drawing, FIG. 7 shows color layouts, vertical charge transfer electrodes, and a circuit to apply a charge readout voltage and drive voltages to the vertical charge transfer electrodes.

A solid-state image pickup device shown in FIG. 7 includes a color layout in which a unit of GRB repeatedly appears in the column direction and a color layout adjacent to the color layout in the row direction in which a unit of RBG repeatedly appears in the column direction. In a row adjacent thereto, there is disposed a color layout in which a unit of BGR repeatedly appears in the column direction. This is a so-called an inclined striped layout.

FIG. 7 shows only rows ranging from a first photoelectric converter row L1 to an 18th photoelectric converter row L18 and subsequent rows ranging from a first photoelectric converter row L1 to a third photoelectric converter row L3. Actually, the group of colors ranging from the photoelectric converter row L1 to the photoelectric converter row L18 is repeatedly arranged many times. The color configuration ranging from L1 to L18 forms one unit. The photoelectric converter rows L1 to L18 is classified into a first group including the photoelectric converter rows L1 to L6, a second group including the photoelectric converter rows L7 to L12, and a third group including the photoelectric converter rows L13 to L18.

For each group of the photoelectric converter rows, a drive circuit D' is arranged to independently apply 12 kinds of drive signals φV1 to φV12. This corresponds to a so-called 12-phase drive method. The rows L1 to L3, L7 to L9, and L13 to L15 are readout photoelectric converter rows, and the rows L4 to L6, L20 to L12, and L16 to L18 are non-readout photoelectric converter rows. To the photoelectric converter elements in each group of three readout photoelectric converter rows described above, readout voltage can be applied independently of the photoelectric converter elements in other groups of the readout photoelectric converter rows, having the same color layout.

For example, in the configuration of FIG. 7, the voltages φV1A, φV1B, and φV1C can be independently applied to the photoelectric converter rows L1, L7, and L13, respectively. The classification of groups A, B, C is employed to apply charge readout pulse signals at mutually different points of timing to the photoelectric converter rows L1, L7, and L13.

Also, the voltages φV3A, φV3B, and φV3C can be independently applied to the photoelectric converter rows L2, L8, and L14, respectively. The voltages φV5A, φV5B, and φV5C can be independently applied to the photoelectric converter rows L3, L9, and L15, respectively.

Description will be given of operation of the solid-state image pickup device, for example, in the photoelectric converter element column on the left-hand side. The signal, for example, a signal G obtained from the photoelectric converter row L1 is transferred to the vertical charge transfer channel region 5 by a readout signal. The G signal is transferred through the vertical charge transfer channel region 5 downward by six photoelectric converter rows. At this point, when an operation to read a G signal from the photoelectric converter row L7 is conducted, the new G signal is transferred to the vertical charge transfer channel region 5. This results in an addition of the G signals of two photoelectric converter elements. The obtained G signal including the charge of each of the photoelectric converter elements is transferred through the vertical charge transfer channel region 5 downward by six photoelectric converter rows. At this point, when an operation to read a G signal from the photoelectric converter row L13 is conducted, the new G signal is transferred to the vertical charge transfer channel region 5. This results in an addition of the new G signal to the vertically transferred G signals of two photoelectric converter elements. Namely, in the photoelectric converter row L13, a signal G including the charge of each of the three photoelectric converter elements is produced. The obtained signal G is transferred to the horizontal charge transfer channel region.

By sequentially changing the group of photoelectric converter rows, the charge readout operation and the charge transfer operation are similarly conducted for the photoelectric converter elements of different colors. That is, at a first readout timing, the charge readout operation is conducted for G(L1) of the first group, B(L9) of the second group, and R(L14) of the third group. After the 6-row transfer operation is conducted, the charge readout operation is conducted for R(L2) of the first group, G(L7) of the second group, and B(L15) of the third group. After the 6-row transfer operation is conducted, the charge readout operation is conducted for B(L3) of the first group, R(L8) of the second group, and G(L13) of the third group.

The R signal from the photoelectric converter row L2 is added to the R signal which is read from the photoelectric converter row L14, not shown, and which is downward transferred to the row L2 to produce an R signal of two photoelectric converter elements. The R signal is further downward transferred to the row L8 to be added to an R signal of the photoelectric converter row L8. As a result, an R signal of three photoelectric converter elements is produced in the row L8. The R signal is then transferred to the horizontal charge transfer channel region.

Similarly, the B signal from the photoelectric converter row L3 is further added to the B signal obtained by adding each other the rows L9 and L15, not shown. Resultantly, a B signal of three photoelectric converter elements is produced in the photoelectric converter row L3. The B signal is then transferred to the horizontal charge transfer channel region. The B signal read from the row L9 shown in FIG. 7 is added to the B signal read from the row L15 shown in FIG. 7 into a B signal of two photoelectric converter elements. The B signal is further added to the B signal from the row L3 shown below in FIG. 7 into a B signal of three photoelectric converter elements. The B signal is then transferred to the horizontal charge transfer channel region.

In FIG. 7, symbols X1, X2, X3, . . . indicate a sequence to apply readout voltages.

Through the operation, although the readout pattern of each readout operation is asymmetric, the readout pattern resultant from the overall readout operations is symmetric. In the photoelectric converter rows classified into 18-row units of a first row 1 to an 18th row 18, the addition can be conducted between the same color signals between the associated three photoelectric converter rows, namely, the first to third rows adjacent to each other in the column direction, the seventh to ninth rows similarly adjacent to each other, and the 13th to 15th rows similarly adjacent to each other. In the configuration of FIG. 7, the three readout photoelectric converter rows adjacent to each other in the column direction and the three non-readout photoelectric converter rows similarly adjacent to each other in the column direction are arranged with an equal interval therebetween.

In an actual readout method, the readout method of the embodiment is applied to a case in which the photoelectric converter rows are classified into groups each of which includes three photoelectric converter rows. The method can also be regarded as a readout method in which it seems that an optical double image is formed using an optical low-pass filter with a pitch substantially equal to the interval between an objective photoelectric converter row and a photoelectric converter row apart from the objective row by six pixels in the column direction.

In the solid-state image pickup device, before the signal charge is transferred to the horizontal charge transfer channel region, signal charge of three pixels of the same color is added to each other in the vertical charge transfer channel region. Therefore, the amount of signals and hence the sensitivity is tripled, and a bright mobile picture is obtained.

The readout photoelectric converter rows (groups) used for the signal readout operation and those not used therefor are arranged with an equal interval in the row direction. This consequently reduces the influence of the false color.

As above, the unit of color layout in the solid-state image pickup device can includes two rows and three rows. It is possible to expand this idea such that the unit includes n rows, where n is an integer equal to or more than two.

The control technique of the solid-state image pickup device of the embodiment is not restricted by the above configuration, but is naturally also applicable to solid-state image pickup devices of other configurations.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What are claimed are:

1. A solid-state image pickup device, comprising:

a semiconductor substrate having a two-dimensional plane on a surface thereof;

photoelectric converter elements formed in or on said two-dimensional plane in a matrix configuration having rows and columns, wherein (m*n) rows of said photoelectric converter elements form a set, where m and n are integers greater than one;

one vertical charge transfer channel region formed in said semiconductor substrate for each of the columns of said photoelectric converter elements, adjacent to said each column;

two charge transfer electrodes so disposed over said vertical charge transfer channel regions for each of the rows of said photoelectric converter elements as to intersect said vertical charge transfer channel regions;

an array of color filters above said photoelectric converter elements, said array including color filters of a plurality of colors arranged in a repeating pattern in the column direction, said repeating pattern comprising a unit of n rows, and said color filters being formed in a one-to-one correspondence with said photoelectric converter elements; and a drive circuit capable of conducting a symmetric readout operation in each set of (m*n) rows of photoelectric converter elements, wherein rows read-out by said symmetric readout operation are distributed with non-readout rows of equal interval in the column direction of said array, said symmetric readout operation comprising:

a first readout operation for reading first electric charges from a first group of photoelectric converter element rows which have an asymmetric distribution with non-readout rows of unequal interval in the column direction into said vertical charge transfer channel regions;

a j×n-rows transfer operation for transferring the read-out first electric charges j×n rows after said first readout operation, where j is an integer greater than one; and a second readout operation for reading second electric charges from a second group of photoelectric converter element rows which have an asymmetric distribution with non-readout rows of unequal interval in the column direction, at positions j×n rows downstream of the rows of said first read-out operation, into said vertical charge transfer channel regions, to respectively add the read-out second electric charges to the transferred first electric charges in said vertical charge transfer channel regions, each one of said read-out second electric charges being added to a respective one of said transferred first electric charges of a same color, said first and second readout operations being capable of reading electric charges from two rows of one unit of photoelectric converter element rows.

2. The solid-state image pickup device according to claim 1, wherein:

said n is two;

said j is m/2; and said symmetric readout operation reads two units per said set.

3. The solid-state image pickup device according to claim 2, wherein:

said m is four;

said symmetric readout operation reads every second unit;

said first readout operation reads a second row of a first unit and a first row of a second unit; and said second readout operation reads a first row of said first unit and a second row of said second unit.

4. The solid-state image pickup device according to claim 1, wherein:

said n is three;

said m is six;

said symmetric readout operation reads three units per said set;

said drive circuit is capable of conducting after said second readout operation:

another j×n-rows transfer operation for transferring the added electric charges j×n rows; and a third readout operation for reading third electric charges from a third group of photoelectric converter element rows which have an asymmetric distribution with respect to any one row of the group, at positions j×n rows downstream from the rows of said second readout operation, into said vertical charge transfer channel regions, to respectively add the read-out third electric charges to the transferred added charges in said vertical charge transfer channel regions.

5. The solid-state image pickup device according to claim 4, wherein:

said three units read out by the symmetric readout operation are distributed every second unit;

said first readout operation reads mutually different rows of first, second, and third units; and said first, second, and third readout operations read electric charge from a first row, a second row, and a third row of said first, second, and third units, respectively.

6. A method of controlling a solid-state image pickup device comprising a semiconductor substrate having a two-dimensional plane on a surface thereof, photoelectric converter elements arranged in a matrix configuration having rows and columns, and formed in said two-dimensional plane, one vertical charge transfer channel region formed in said semiconductor substrate for each of the columns of said photoelectric converter elements, adjacent to said each column, two charge transfer electrodes so disposed over said vertical charge transfer channel regions for each of the rows of said photoelectric converter elements as to intersect said vertical charge transfer channel regions, and array of color filters formed above said photoelectric converter elements in one-to-one correspondence to said photoelectric converter elements, said array including color filters of a plurality of colors, and having repetitive units of layout along the column direction, each unit being composed of n rows, where n is an integer larger than one, said method comprising the steps of:

(a) enabling (m*n) rows of photoelectric converter elements as one set, where m is an integer greater than one, to read first electric charges from a first group of photoelectric converter element rows which have an asymmetric distribution with non-readout rows of unequal interval in the column direction into said vertical charge transfer channel regions;

(b) transferring the read-out first electric charges j×n rows, where n is an integer greater than one, after said readout step (a); and (c) reading second electric charges from a second group of photoelectric converter element rows which have an asymmetric distribution with non-readout rows of unequal interval in the column direction, at positions j×n rows downstream from the rows of said readout step (a), into said vertical charge transfer channel regions, to respectively add the read-out first and transferred second electric charges of a same color to each other in said vertical charge transfer channel regions, said first and second readout steps (a) and (c) being capable of reading electric charges from two rows of one unit of photoelectric converter element rows.

7. The method of controlling a solid-state image pickup device according to claim 6, wherein:

said n is two;

said j is m/2; and said readout steps (a) and (c) read two units per said set.

8. The method of controlling a solid-state image pickup device according to claim 7, wherein:

said reading steps (a) and (c) read every second unit;

said reading step (a) reads a second row of a first unit and a first row of a second unit; and said reading step (c) reads a first row of said first unit and a second row of said second unit.

9. The method of controlling a solid-state image pickup device according to claim 6, wherein:

said n is three;

said m is six; and said method further comprising the steps of;

(d) transferring the added electric charges for j×n rows after said second reading step (c); and (e) reading third electric charges from a third group of photoelectric converter element rows which have an asymmetric distribution with respect to any one row of the group, at positions j×n rows downstream from the rows of said reading step (c), to said vertical charge transfer channel regions, to respectively add the read-out third and transferred added electric charges of a same color to each other in said vertical charge transfer channel regions.

10. The method of controlling a solid-state image pickup device according to claim 9, wherein:

said reading step (a) reads mutually different rows of first, second, and third units at every second unit; and said steps (a), (c), and (e) read electric charges from a first row, a second row, and a third row of said first, second, and third units, respectively.

11. A method of controlling a solid-state image pickup device, comprising a semiconductor substrate having a two-dimensional plane on a surface thereof;

a plurality of photoelectric converter elements arranged in the two-dimensional plane in a matrix configuration having rows and columns;

an array of color filters including a plurality of units, each unit consisting of two adjacent photoelectric converter element rows, said units being repeatedly and contiguously arranged in said array in a column direction, in which one color filter of the array is formed over each of said photoelectric converter elements, wherein, the first row of each unit has a first color layout of color filters arranged in a row direction and the second row of each unit has a second color layout of color filters arranged in the row direction, said second color layout being different from said first color layout;

one vertical charge transfer channel region formed in said semiconductor substrate for each of the columns of said photoelectric converter elements, adjacent to said each column;

a plurality of vertical charge transfer electrodes in which two vertical charge transfer electrodes are disposed over said vertical charge transfer channel regions for each of the rows of said photoelectric converter elements; and a drive circuit capable of applying readout pulse voltages to said vertical charge transfer electrodes corresponding to said photoelectric converter element row having said first color layout in a first unit and to said vertical charge transfer electrodes corresponding to said photoelectric converter element row having said second color layout in a second unit, said photoelectric converter element row having said second color layout in said second unit being at a position apart from said photoelectric converter element row having said first color layout in said first unit by four photoelectric converter element rows in the column direction;

said method comprising the steps of:

a) classifying said vertical charge transfer electrodes into sets each of which includes 16 vertical charge transfer electrodes as one set, said 16 vertical charge transfer electrodes ranging from a first vertical charge transfer electrode to a 16th vertical charge transfer electrode succeeding one after another, and applying readout pulse voltages to said vertical charge transfer electrodes belonging to said photoelectric converter element row having said first color layout of said first unit, said first unit being selected from each said set and to said vertical charge transfer electrodes belonging to said photoelectric converter element row having said second color layout different from said first color layout of said second unit, the photoelectric converter element rows having said second color layout of said second unit being formed in positions spaced apart from positions of the photoelectric converter element rows having said first color layout of said first unit by four photoelectric converter element rows in the column direction;

b) transferring the signal charge read out by said step a) through said vertical charge transfer channel regions for four photoelectric converter element rows in the column direction;

c) applying readout pulse voltages to said vertical charge transfer electrodes belonging to said photoelectric converter element rows of said first and second units, which are not used to read the electric charge therefrom in said step a); and d) transferring the electric charge read out in said step c) and the electric charge read out in said step a) in said vertical charge transfer channel regions.

12. The method of controlling a solid-state image pickup device according to claim 11, wherein said device further comprises a variable barrier formed in said semiconductor substrate, said variable barrier being capable of modulating an amount of electric charge accumulable in each of said photoelectric converter elements, said method further comprising the step of x) modulating by said variable barrier an amount of electric charge accumulable in each of said photoelectric converter elements to one half of an original amount thereof before said step a).

* * * * *